United States Patent [19]

Daikoku et al.

[11] Patent Number: 5,349,831
[45] Date of Patent: Sep. 27, 1994

[54] APPARATUS FOR COOLING HEAT GENERATING MEMBERS

[75] Inventors: Takahiro Daikoku, Ushiku; Hiroshi Inouye, Ibaraki, both of Japan

[73] Assignee: Hitachi, Ltd., Tokyo, Japan

[21] Appl. No.: 972,844

[22] Filed: Nov. 6, 1992

[30] Foreign Application Priority Data

Nov. 8, 1991 [JP] Japan .................. 3-293115

[51] Int. Cl.⁵ .................... F28D 7/12; H05K 7/20
[52] U.S. Cl. ............................. 62/376; 62/64;
62/259.2; 165/80.4; 165/908; 361/282
[58] Field of Search ............... 62/376, 64, 259.2;
165/80.4, 908; 361/282, 283

[56] References Cited

U.S. PATENT DOCUMENTS

| | | | |
|---|---|---|---|
| 3,609,991 | 10/1971 | Chu et al. | 62/259.2 X |
| 4,203,129 | 5/1980 | Oktay et al. | 361/382 X |
| 4,729,060 | 3/1988 | Yamamoto et al. | 361/382 X |
| 4,741,385 | 5/1988 | Bergles et al. | 165/908 X |
| 4,750,086 | 6/1988 | Mittal | 361/382 |
| 4,783,721 | 11/1988 | Yamamoto et al. | 361/382 |
| 4,882,654 | 11/1989 | Nelson et al. | 361/382 |
| 4,910,642 | 3/1990 | Downing | 361/382 |
| 4,940,085 | 7/1990 | Nelson et al. | 165/908 X |
| 4,977,444 | 12/1990 | Nakajima et al. | 361/382 X |
| 5,021,924 | 6/1991 | Kieda et al. | 165/908 X |
| 5,097,385 | 3/1992 | Chu et al. | 361/382 |
| 5,183,104 | 2/1993 | Novotny | 62/259.2 X |
| 5,212,626 | 5/1993 | Bell et al. | 62/259.2 X |
| 5,228,502 | 7/1993 | Chu et al. | 165/908 X |
| 5,239,443 | 8/1993 | Fahey et al. | 165/80.4 X |

Primary Examiner—Henry A. Bennet
Assistant Examiner—C. Kilner
Attorney, Agent, or Firm—Antonelli, Terry, Stout & Kraus

[57] ABSTRACT

An apparatus for cooling heat generating members such as semiconductor devices on a multichip module. A discharge device discharges cooling liquid for contacting the heat generating members and cooling them. A mixing device mixes the now high temperature cooling liquid, which has cooled the heat generating members, with another portion of the aforesaid cooling liquid still at a lower temperature. As a result, the temperature of the high temperature cooling liquid, which has been heated because it had cooled the heat generating members, can be lowered because the high temperature cooling liquid is mixed with the low temperature cooling liquid. Furthermore, a cooling liquid discharge device is provided for each heat generating member and a mixing device is located between the cooling liquid discharge devices or between heat generating members. In addition, the mixing device has a guide member for guiding the flow.

7 Claims, 14 Drawing Sheets

F I G. 2
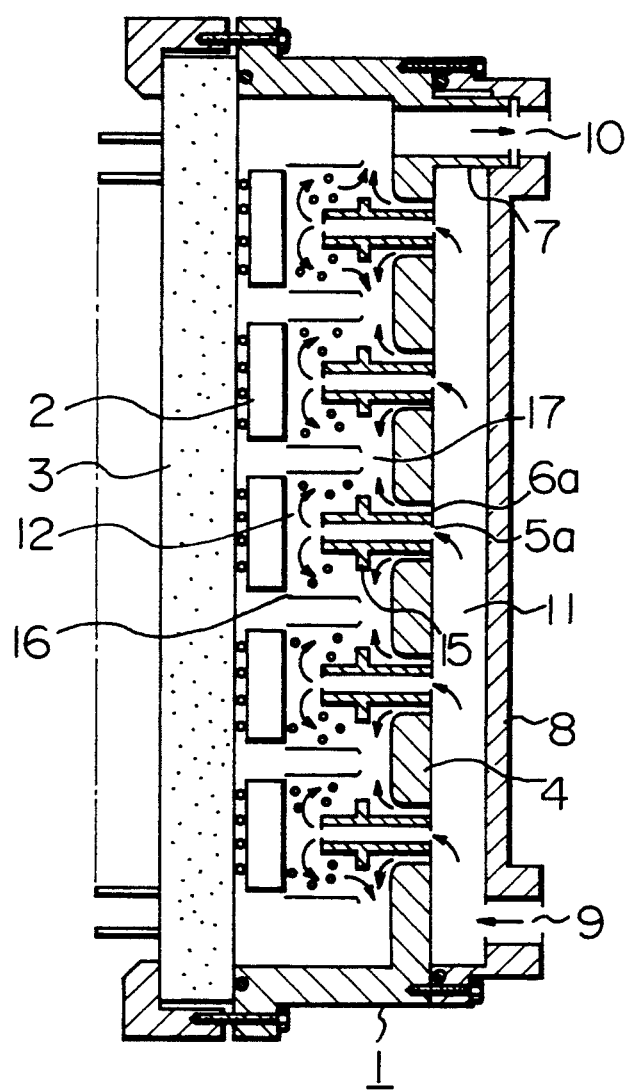

F I G. 5
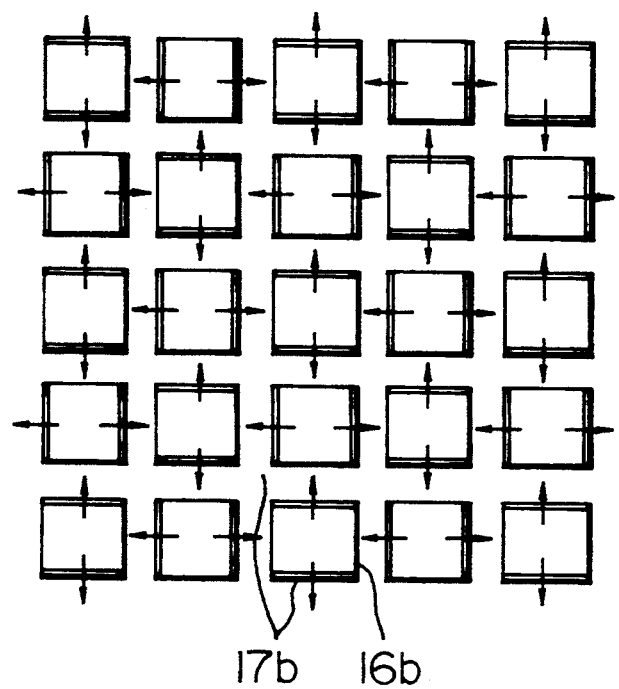

F I G. 16
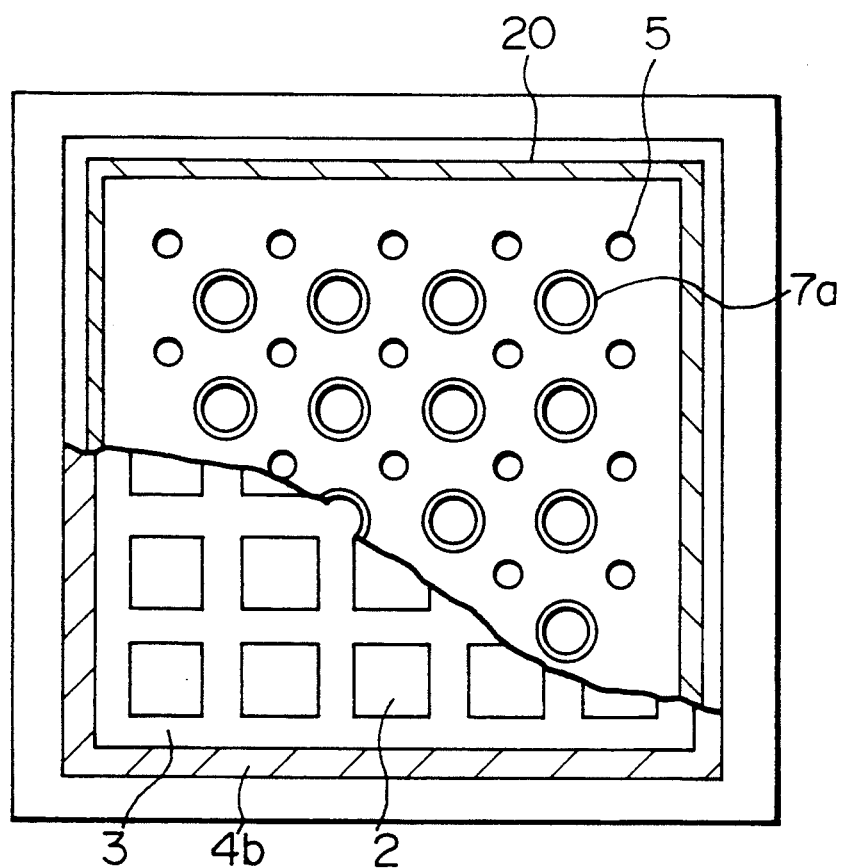

APPARATUS FOR COOLING HEAT GENERATING MEMBERS

BACKGROUND OF THE INVENTION

The present invention relates to an apparatus for cooling heat generating members, and, more particularly, to a boiling or dipping type cooling apparatus which is capable of improving the efficiency of cooling heat generating members such as semiconductor devices, which can also be easily assembled.

Since computers must have fast processing speeds, a method has been recently developed in which LSIs (Large Scale Integrated circuits) are mounted at high density. Therefore, the LSIs generate excessively large heating values, and the semiconductor devices, on which the LSIs are mounted at high density, also generate excessively dense heat. Hence, it become more critical that the LSIs are efficiently cooled.

As disclosed in, for example, Japanese Patent Publication No. 3-20070 or Japanese Utility Model Publication No. 3-7960, conventional cooling apparatuses cool the LSIs (Large Scale Integrated circuits) by dipping the LSIs in refrigerant liquid having a low boiling point or by boiling refrigerant liquid by spraying pressurized refrigerant liquid having a low boiling point to the LSIs through nozzles.

The aforesaid conventional cooling apparatus which cools the LSIs (Large Scale Integrated circuits) by causing boiling to take place by dipping them into refrigerant liquid and which has been disclosed in Japanese Patent Publication No. 3-20070 is arranged in such a manner that the deterioration of the performance of cooling the LSIs disposed in the upper portion in the vertical direction is prevented even if the cooling liquid starts boiling and if boiled bubbles are generated with the rise of the operation temperature of the LSIs, the deterioration being prevented by allowing the boiled bubbles to disappear by the action of a cooling heat exchanging pipe located in the refrigerant liquid. However, the convection currents generated in the refrigerant liquid due to dipping and boiling is unsatisfactory because the cooling heat exchanging pipe is simply dipped in the refrigerant liquid having a low boiling point. Since the temperature of the refrigerant liquid depends upon the pressure in the refrigerant liquid container, it is difficult to cause the boiled bubbles to efficiently disappear. What is worse, the performance of cooling the LSIs is unsatisfactory because the refrigerant liquid has poor cooling performance. In addition, in the dipping and boiling cooling method, the temperature of the LSI rapidly rises after it has started generating heat until the refrigerant liquid starts boiling. Therefore, the temperature of the LSI rises to a level considerably higher than the designed final temperature if boiling is not smoothly commenced and, as a result, unsatisfactory reliability of the LSI arises.

Accordingly, the cooling apparatus disclosed in Japanese Utility Model Publication No. 3-7960 is arranged in such a manner that the pressurized refrigerant liquid having a low boiling point is sprayed to the LSIs through nozzles. Since boiling is commenced quickly in the aforesaid boiling type cooling apparatus, the aforesaid overshooting of the temperature of the LSIs can substantially be prevented. However, its simple structure in which the refrigerant liquid having a low boiling point is sprayed to the LSIs will deteriorate the performance of cooling the LSIs because the LSIs disposed in the lower stream of the refrigerant liquid flow are undesirably covered with boiled bubbles if an excessively large quantity of the boiled bubbles are generated in the case where the heating values of the LSIs are excessively large. If a large quantity of the refrigerant liquid is sprayed to the LSIs through the nozzles, an excessively heavy load acts on the LSIs or the junctions of the LSIs, causing a problem to take place in that the reliability of the LSI deteriorates. Hence, the flow velocity and the flow rate of the refrigerant liquid are limited and therefore the cooling performance is undesirably limited. What is worse, discharge of gas-liquid phase refrigerant liquid including the boiled bubbles from the container which accommodates the refrigerant liquid will cause a portion of the boiled bubbles to be retained at an intermediate position of the piping for the refrigerant liquid. As a result, the flow of the refrigerant liquid is made intermittent and unstable.

Therefore, each of the aforesaid conventional structures has been unsatisfactory in terms of overcoming the excessive large heating value of the LSIs and therefore the performance of cooling the LSIs has been insufficient.

SUMMARY OF THE INVENTION

An object of the present invention is to provide an apparatus for cooling heat generating members capable of efficiently cooling the heat generating members such as LSIs which generate excessively large heating value.

Another object of the present invention is to provide an apparatus for cooling heat generating members capable of stabling the flow of refrigerant liquid by causing boiled bubbles in a gas-liquid phase refrigerant liquid flow to quickly disappear, and efficiently cooling heat generating members such as LSIs which generate excessively large heating values, in order to improve the reliability of the heat generating members or the junctions of the heat generating members.

Another object of the present invention is to provide an apparatus for cooling heat generating members arranged in such a manner that the quantity of low temperature refrigerant liquid to be jetted or mixed is controlled in accordance with the state of disappearance of boiled bubbles in a high temperature refrigerant liquid flow in order to cause boiled bubbles in a gas-liquid phase refrigerant liquid flow to quickly disappear.

Another object of the present invention is to provide an apparatus for cooling heat generating members capable of reducing the size of an external cooler which cools gas-liquid phase high temperature refrigerant liquid.

Another object of the present invention is to provide an apparatus for cooling heat generating members capable of efficiently cooling a multiplicity of heat generating members by restricting the mutual interferences of the heat generating members when they are cooled and by preventing the fluid loss of the refrigerant liquid.

In order to achieve the aforesaid objects, according to the present invention, an apparatus for cooling heat generating members by a refrigerant liquid flow, includes means for branching a portion of low temperature refrigerant liquid for cooling the heat generating members and mixing, with each other, the branched low temperature refrigerant liquid and high temperature refrigerant liquid which has cooled the heat generating members.

In accordance with further features of the present invention, there is provided an apparatus for cooling heat generating members by dipping or boiling by means of a refrigerant liquid flow includes means for branching a portion of low temperature refrigerant liquid for cooling the heat generating members and mixing, with each other, the branched low temperature refrigerant liquid and liquid phase or gas-liquid phase high temperature refrigerant liquid which has cooled the heat generating members.

According to yet further features of the present invention, an apparatus for cooling heat generating members by a refrigerant liquid flow includes mixing means for branching a portion of low temperature refrigerant liquid for cooling at least one of the heat generating members, and jetting the branched low temperature refrigerant liquid into a gas-liquid phase high temperature refrigerant liquid flow which has cooled the heat generating members before it is discharged or mixing the same with the high temperature refrigerant liquid, so that the gas phase in the high temperature refrigerant liquid flow disappears.

According to the present invention, an apparatus for cooling heat generating members by a refrigerant liquid flow includes heat generating members comprising mixing means having second nozzles disposed adjacent to first nozzles for jetting low temperature refrigerant liquid to the heat generating members so as to jet a portion of the low temperature refrigerant liquid from the second nozzles into a gas-liquid phase high temperature refrigerant flow which has cooled the heat generating members before it is discharged so that gas phase boiled bubbles in the high temperature refrigerant liquid flow is caused to disappear.

According to still further features of the present invention, an apparatus for cooling heat generating members by a refrigerant liquid flow includes mixing means having second nozzles which are arranged around first nozzles for jetting low temperature refrigerant liquid to the heat generating members, and which jet a portion of the low temperature refrigerant liquid into a gas-liquid phase high temperature refrigerant liquid flow which has cooled the heat generating members before it is discharged, and flow guides arranged around the heat generating members and acting to prevent an influence of the high temperature refrigerant liquid flow on the other heat generating members, so that the high temperature refrigerant liquid flow is suctioned by the flow guides and jet flows from the second nozzles so as to mix the high temperature refrigerant liquid flow and the low temperature refrigerant liquid with each other so that gas phase boiled bubbles disappear.

According to the present invention, an apparatus for cooling heat generating members by a refrigerant liquid flow includes mixing means for jetting or mixing a portion of low temperature refrigerant liquid for cooling the heat generating members into a high temperature refrigerant liquid flow in outlet pipe from an intermediate position of the outlet pipe through which gas-liquid phase high temperature refrigerant liquid flow, which has cooled the heat generating members, is discharged so that gas phase boiled bubbles in the high temperature refrigerant liquid flow disappear.

According additional features of the present invention, an apparatus for cooling heat generating members by a refrigerant liquid flow includes defoaming means for separating high temperature refrigerant liquid flow into a gas phase and a liquid phase and spraying or mixing a portion of low temperature refrigerant liquid into an intermediate position of an outlet pipe which discharges the high temperature refrigerant liquid flow in a gas-liquid phase which has cooled the heat generating members before it is discharged so that gas phase vapor is caused to disappear.

According to the present invention, an apparatus for cooling heat generating members by a refrigerant liquid flow includes mixing means for spraying or mixing low temperature refrigerant liquid into high temperature refrigerant liquid flow in an outlet port from an intermediate position of the outlet pipe which discharges the high temperature refrigerant liquid flow in a gas-liquid phase which has cooled the heat generating members before it is discharged so that gas phase boiled bubbles in the high temperature refrigerant liquid flow is made to disappear.

In accordance with yet additional features of the present invention, an apparatus for cooling heat generating members by a refrigerant liquid flow includes one or a plurality of outlet pipes for discharging high temperature refrigerant liquid flow which has cooled the heat generating members before it is discharged, with the one or a plurality of outlet pipes being inserted into a high temperature refrigerant liquid discharge port formed in the outer wall of a header for jetting low temperature refrigerant liquid to the heat generating members.

According to the present invention, an apparatus for cooling a plurality of heat generating members by a refrigerant liquid flow includes nozzles for jetting the refrigerant liquid flow to the heat generating members and respectively disposed to the heat generating members and outlet pipes for discharging high temperature refrigerant liquid flow which has cooled the heat generating members before it is discharged, the outlet pipes being respectively disposed between the disposed nozzles.

By virtue of the features of the present invention, the low temperature refrigerant liquid for cooling the heat generating members is branched to be mixed with the high temperature refrigerant liquid which has cooled the heat generating members. Therefore, the liquid phase or gas-liquid phase high temperature refrigerant liquid which has cooled the heat generating members by dipping or boiling them can always be made to low temperature refrigerant liquid so that the heat generating members such as LSIs disposed in the lower stream can be cooled efficiently.

When low temperature refrigerant liquid is sprayed to heat generating members such as LSIs from nozzles to cool the heat generating members, the structure in which a portion of the low temperature refrigerant liquid is branched to be jotted or mixed with the gas-liquid phase high temperature refrigerant liquid flow which has cooled the heat generating members before it is discharged will cause the gas phase vapor bubbles in the high temperature refrigerant liquid flow to be efficiently condensed and to disappear. Therefore, the problem in that the boiled bubbles undesirably cover the heat generating members such as the LSIs disposed in the lower stream of the refrigerant liquid flow causing the cooling performance to deteriorate can be prevented. As a result, even heat generating members which generate excessively large heating values, which generate an excessively large quantity of boiled bubbles, can be cooled sufficiently. Since the heat generating members can be cooled efficiently while eliminating the necessity of spraying a large quantity of refrigerant liquid flows through nozzles, a large load does not act on the heat generating members or the junctions of the heat generating members, causing the reliability of the heat generating members to be improved.

Even if a plurality of the heat generating members such as LSIs must be cooled, a portion of the low temperature refrigerant liquid flow cools the heat generating members and is sequentially introduced into the gas-liquid phase high temperature refrigerant liquid, causing the quantity of the refrigerant liquid flow, which passes over the heat generating member, to increase toward the lower stream. As a result, the rise of the temperature of the gas-liquid phase high temperature refrigerant liquid, which cools the heat generating members before it is discharged, can be prevented.

Furthermore, the construction of the present invention is arranged in such a manner that a portion of the low temperature refrigerant liquid for cooling the heat generating member is jetted into or mixed with the gas-liquid phase flow from an intermediate position of the outlet pipe for discharging the gas-liquid phase high temperature refrigerant liquid flow which has cooled the heat generating members before it is discharged. As a result, the gas phase boiled bubbles in the gas-liquid phase high temperature refrigerant liquid flow, which has cooled the heat generating members before it is discharged, can efficiently be condensed and caused to disappear. Hence, the problem of the undesirable partial retention of the boiled bubbles at an intermediate position of the high temperature refrigerant liquid discharge pipe causing the flow of the refrigerant liquid to become intermittent and unstable can be prevented. As a result, the heat generating members can always stable be cooled.

Furthermore, the construction of the present invention is arranged in such a manner that second nozzles for jetting a portion of the low temperature refrigerant liquid into the gas-liquid phase high temperature refrigerant liquid flow are disposed around the first nozzles for jetting the low temperature refrigerant liquid to the heat generating members, and flow guides for preventing the influence of the gas-liquid phase high temperature refrigerant liquid flow, which has cooled the heat generating members before it is discharged, upon the other heat generating members are disposed around the heat generating members. As a result, the gas-liquid phase high temperature refrigerant liquid flow, which has cooled the heat generating members before it is discharged, is positively suctioned by the flow guides and the jetted flows from the second nozzles. Hence, the gas phase boiled bubbles in the gas-liquid phase high temperature refrigerant liquid flow, which has cooled the heat generating members before it is discharge from the flow guides, can efficiently be condensed and they are caused to disappear. Therefore, even heat generating members which generate excessively large heating values which generate an excessively large quantity of boiled bubbles can sufficiently be cooled.

In addition, the gas phase and the liquid phase of the high temperature refrigerant liquid flow are separated from each other, and a portion of the low temperature refrigerant liquid for cooling the heat generating members is jetted or sprayed or mixed to an intermediate position of the outlet pipe for discharging the gas-liquid phase high temperature refrigerant liquid flow which has cooled the heat generating members before it is discharged. Hence, the gas phase vapor can efficiently be condensed and caused to disappear. As a result, the heat generating members which generate high heating values can always be cooled stably and sufficiently.

In addition, the refrigerant liquid, which has been cooled by the external cooler, is jetted or mixed with the gas-liquid phase flow at an intermediate position of the outlet pipe for discharging the gas-liquid phase high temperature refrigerant liquid flow which has cooled the heat generating members before it is discharged. Therefore, the gas phase boiled bubbles in the gas-liquid phase high temperature refrigerant liquid flow, which has cooled the heat generating members before it is discharged, can be condensed quickly and efficiently, and they can be caused to disappear. Thus, the heat generating members which generate large heating values can always be cooled stably and sufficiently.

In addition, the quantity of the boiled bubbles in the high temperature refrigerant liquid flow is monitored so that the quantity of the low temperature refrigerant liquid flow to be jetted or mixed with the gas-liquid phase high temperature refrigerant liquid flow is controlled. As a result, the heat generating members can always be cooled stably.

Moreover, the outlet pipe for discharging the high temperature refrigerant liquid flow, which has cooled the heat generating members before it is discharged, is simply inserted into the high temperature refrigerant liquid discharging port formed in the outer wall of the header for jetting the low temperature refrigerant liquid to the heat generating members. Therefore, the apparatus for cooling the heat generating members such as the semiconductor devices can easily be assembled and disassembled.

Furthermore, the nozzles for jetting the refrigerant liquid flow to the heat generating members are provided for the corresponding heat generating members, and the outlet pipes for discharging the high temperature refrigerant liquid flow, which has cooled the heat generating members before it is discharged, are disposed between the disposed nozzles. Therefore, the mutual influences of the high temperature refrigerant liquid flow, which has cooled the heat generating members before it is discharged, can be prevented at the time of cooling the heat generating members. Hence, the flow loss of the introduction and the discharge of the refrigerant liquid can be prevented so that a multiplicity of the heat generating members can efficiently be cooled.

Other and further objects, features and advantages of the invention will be appear more fully from the following description.

BRIEF DESCRIPTION OF THE DRAWINGS

FIG. 2 is a cross sectional view which illustrates a second embodiment of the present invention;

FIG. 5 illustrates the outlet ports of the flow guides shown in FIG. 4;

FIG. 16 is a horizontal cross sectional view which illustrates the configuration of outlet ports for discharging a high temperature refrigerant liquid flow and low temperature refrigerant liquid jetting nozzles.

DESCRIPTION OF THE PREFERRED EMBODIMENTS

Preferred embodiments of the present invention will now be described with reference to the drawings.

Figure 1:
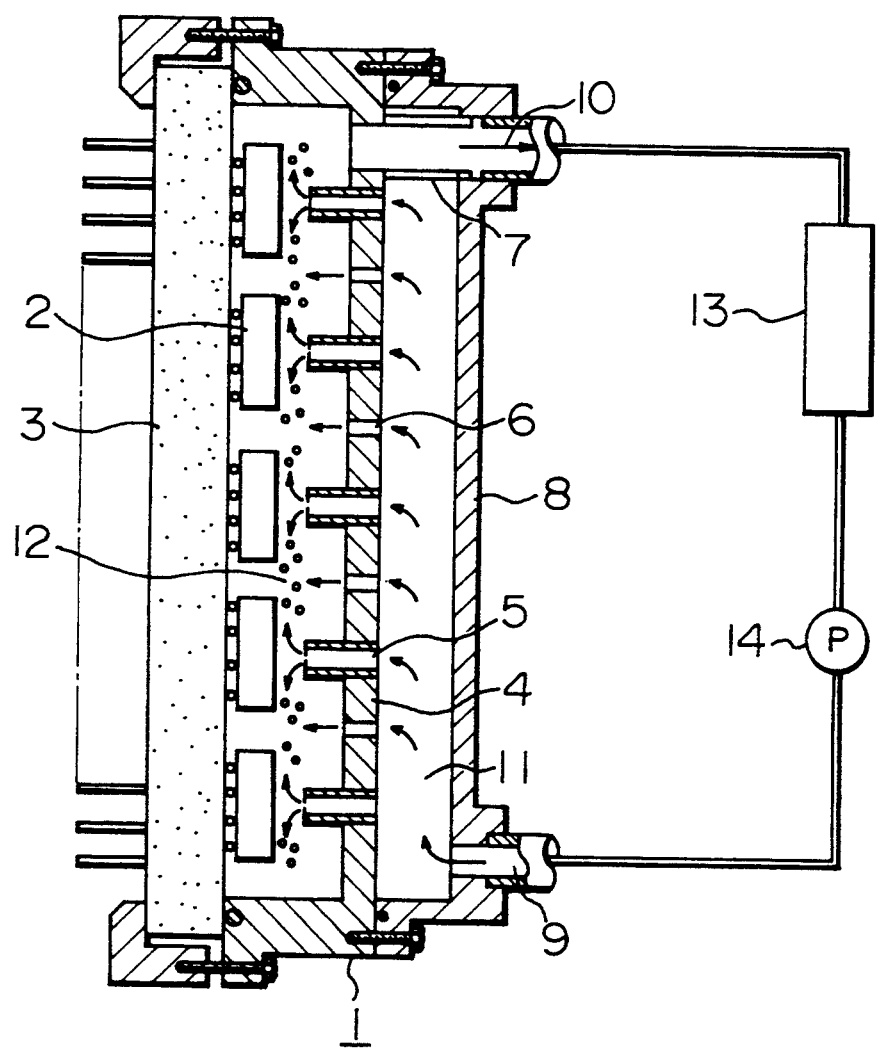
FIG. 1 is a cross-sectional view which illustrates a first embodiment of the present invention in which semiconductor devices, for example, LSIs, forming heat generating members, are cooled by a multi-shaped module system for introducing/discharging cooling liquid.

Referring now to the drawings wherein like reference numerals are used throughout the various views to designate like parts and, more particularly, to FIG. 1, according to this figure, a multichip module 1 is constructed in such a manner that a multilayered printed circuit board 3, made of ceramic, having a plurality of semiconductor devices 2, each including the LSI chip which generates heat, is sealed by a housing. The housing includes first nozzles 5 for jetting refrigerant liquid having a low temperature to each semiconductor device 2, second nozzles disposed adjacent to the first nozzles for jetting a portion of low temperature refrigerant liquid 11 and discharge pipes 7 through which high temperature refrigerant liquid 12, after having cooled each semiconductor device 2, is discharged. A refrigerant liquid introducing/discharging header 8 is located above the housing 4 to cover the housing 4, with the refrigerant liquid introducing/discharging header 8 having a low temperature refrigerant liquid inlet port 9 and a high temperature refrigerant liquid outlet port 10 into which a high temperature refrigerant liquid discharge pipe 7 is inserted. An external cooler 13 and a pressure pump 14 are located between the high temperature refrigerant liquid outlet port 10 and the low temperature refrigerant liquid inlet port 9 connected by pipes.

In accordance with the embodiment of FIG. 1, when the low temperature refrigerant liquid 11 introduced through the low temperature refrigerant liquid inlet port 9 of the refrigerant liquid introducing/discharging header 8 is jetted from each of the first nozzles 5 facing the corresponding semiconductor devices 2 to the semiconductor devices 2, the low temperature refrigerant liquid 11 is heated to a temperature higher than its boiling point by the semiconductor devices 2, causing boiled bubbles to be generated fiercely. As a result, the low temperature refrigerant liquid 11 is converted into the high temperature refrigerant liquid 12 in the gas-liquid phase including the boiled bubbles, the flow of the high temperature refrigerant liquid 12 cooling the semiconductor devices 2 before it is discharged. When the portion of the low temperature refrigerant liquid 11 is jetted from the second nozzles 6 into the flow of the high temperature refrigerant liquid 12 in the gas-liquid phase in order to be mixed before the flow of the high temperature refrigerant liquid 12 in the gas-liquid phase including the boiled bubbles reaches the adjacent semiconductor device 2 located downstream, the temperature of the high temperature refrigerant liquid 12 is rapidly lowered so that the vapor bubbles in the gas phase included in the flow of the high temperature refrigerant liquid 12 are efficiently condensed to disappear. The refrigerant liquid, which has sequentially cooled a multiplicity of the semiconductor devices 2 and therefore the temperature of which has been raised, passes through the high temperature refrigerant liquid discharge pipe 7, and then the refrigerant liquid is discharged through the high temperature refrigerant liquid outlet port 10 of the refrigerant liquid introducing/discharging header 8. The refrigerant liquid is then subjected to heat exchange by the external cooler 13 connected to a refrigerator or the like so that the temperature of the refrigerant liquid is lowered before it is again introduced into the low temperature refrigerant liquid inlet port 9 by the pressure pump 14.

Since the structure according to the embodiment of FIG. 1 is arranged in such a manner that the high temperature refrigerant liquid discharge pipe 7 is simply inserted into the high temperature refrigerant liquid outlet port 10 of the refrigerant liquid introducing/discharging header 8, it is sufficient that the refrigerant liquid introducing/discharging header 8 covers the housing 4. Therefore, the cooling structure included by the multichip module 1 for introducing/discharging the refrigerant liquid can easily be assembled and disassembled.

Although the structure shown in FIG. 1 is arranged in such a manner that one first nozzle 5 and one second nozzle 6 are disposed to face each semiconductor device 2, a plurality of the nozzles may face each semiconductor device 2. In the case where the semiconductor devices 2 have different heating values, the size of the first nozzle 5 or that of the second nozzle 6 may be changed to correspond to the heating value of each of the semiconductor devices 2.

Since the refrigerant liquid must be chemically stable, free from corrosiveness, have electrically insulating characteristics and have a boiling point in the range of a temperature to 85° C. or lower, it is preferable that the refrigerant liquid be a carbon fluoride type refrigerant or a halogenated hydrocarbon refrigerant.

Figure 3:
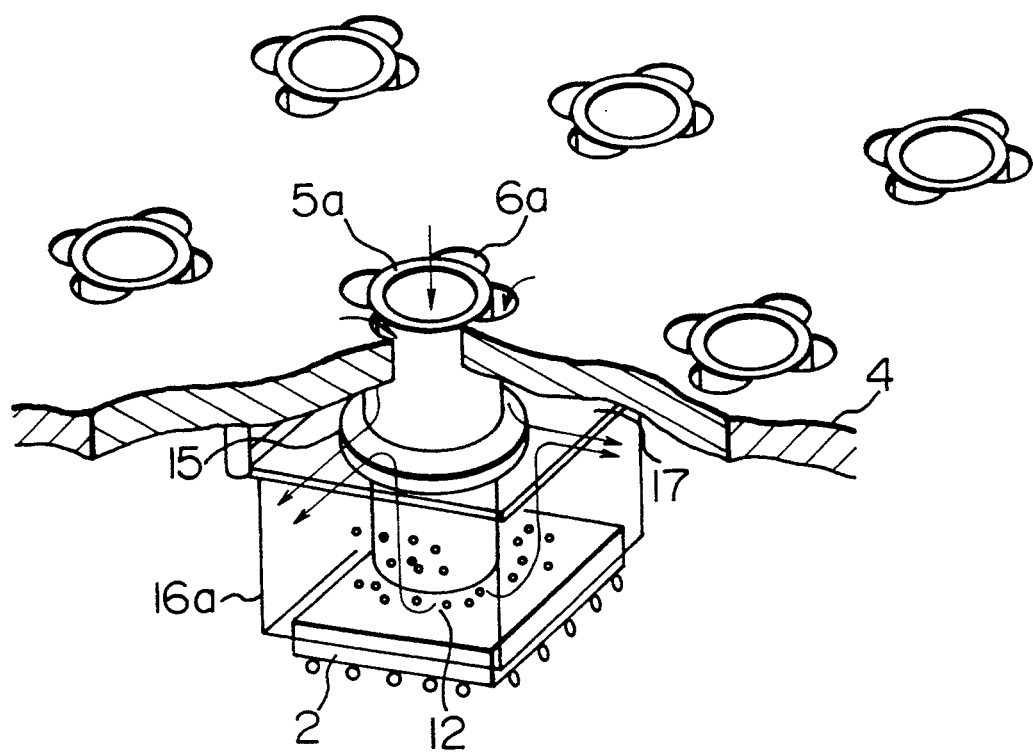
FIG. 3 is a perspective view in which the cross section of a portion of an essential portion shown in FIG. 2 is enlarged.

As shown in FIGS. 2 and 3, a plurality of second nozzles 6a are concentrically disposed around the first nozzles 5a for jetting the low temperature refrigerant liquid 11 to the semiconductor device 2. Furthermore, a disc-like projection 15 for changing the direction of the flow of the low temperature refrigerant liquid 11 discharged from the second nozzle 6a is located around each of the first nozzles 5a. In addition, flow guides 16 are supported above the semiconductor devices 2 by the housing 4 to surround the semiconductor devices 2. An outlet port 17 for discharging the high temperature refrigerant liquid 12 in the gas-liquid phase which has cooled each of the semiconductor devices 2 and the low temperature refrigerant liquid 11 jetted from each of the second nozzles 6a is disposed between each of the flow guides 16a and the housing 4.

In accordance with the embodiment FIGS. 2 and 3, the low temperature refrigerant liquid 11 jetted from the first nozzles 5a is heated to a temperature higher than the boiling point due to heat generated by the semiconductor devices 2, causing boiled bubbles to be generated vigorously. The high temperature refrigerant liquid 12 in the gas-liquid phase including the boiled bubbles is, by the flow guide 16, returned into a direction opposing the direction in which the low temperature refrigerant liquid 11 has been jetted from the first nozzles 5a, and is positively sucked due to the injection effect of the jetted flow of the low temperature refrigerant liquid 11 the direction of which has been changed by the second nozzles 6a and the disc-like projections 15. Hence, the high temperature refrigerant liquid 12 becomes a refrigerant liquid flow to be discharged through the outlet ports 17 disposed between the flow guide 16a and the housing 4.

Since a portion of the low temperature refrigerant liquid 11 is jetted from the second nozzles 6a into the flow of the high temperature refrigerant liquid 12 in the gas-liquid phase to be mixed vigorously with the high temperature refrigerant liquid 12 in the outlet port 17, the temperature of the flow of the high temperature refrigerant liquid 12 is rapidly lowered. Hence, the vapor bubbles in the gas phase included by the high temperature refrigerant liquid flow can be more efficiently condensed and they disappear. The flow guides 16 is, as well as changing the direction of the flow, able to eliminate the influence of the high temperature refrigerant liquid flow in the gas-liquid phase, which has cooled the semiconductor devices 2 before it is discharged.

Figure 4:
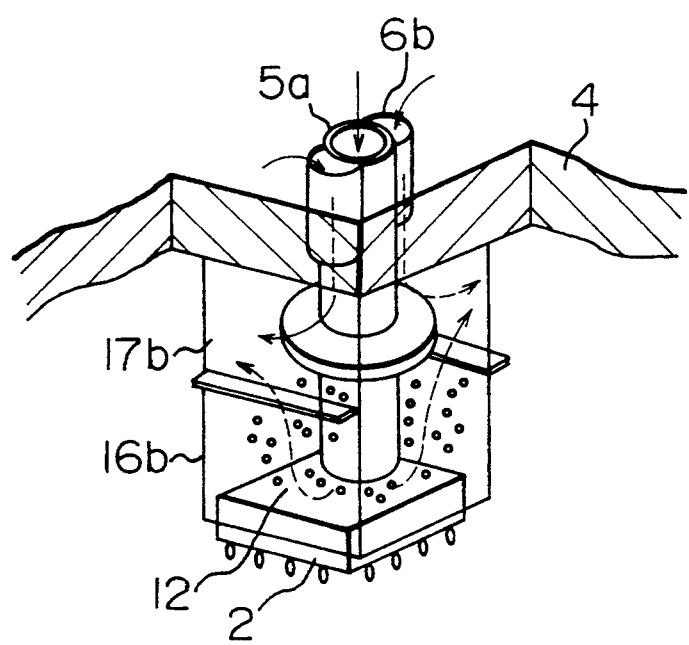
FIG. 4 is a perspective view in which the cross section of a portion of an essential portion of a third embodiment of the present invention is enlarged.
Figure 6:
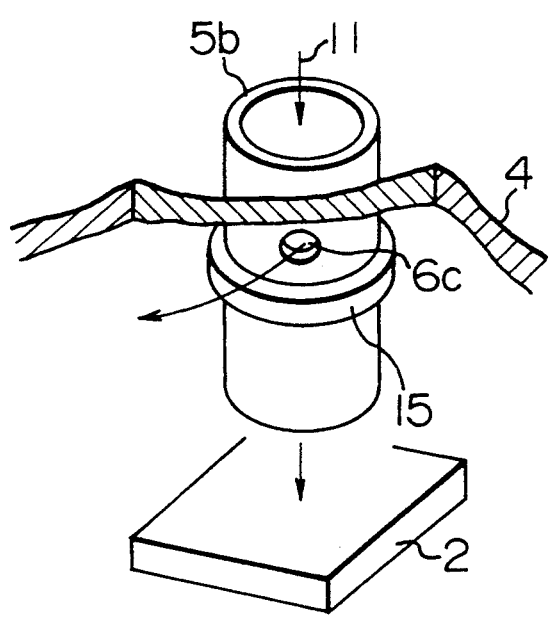
FIG. 6 is a perspective view in which the cross section of a portion of an essential portion of a fourth embodiment of the present invention is enlarged.

As shown in FIGS. 4 and 5, discharge ports 17b are formed between flow guides 16b and the housing 4. The discharge ports 17b of the flow guides 16b are disposed to face each other in such a manner that the discharge ports 17b are perpendicular to the adjacent semiconductor devices 2. Therefore, the directions of the flows of the refrigerant liquid discharged through the discharge ports 17b are different from one another depending upon the semiconductor devices 2 in the structure according to the embodiment of FIGS. 4 and 5. Hence, the flows of the refrigerant liquid are able to be discharged stably because they do not interfere with one another. As shown in FIG. 6, a second nozzle 6c is formed in the wall of the first nozzle 5b which jets the low temperature refrigerant liquid 11 to the semiconductor device 2 so that the low temperature refrigerant liquid 11 is branched through the second nozzle 6c when it passes through the first nozzle 5b. Since the first nozzle 5b and the second nozzle 6c can be integrally formed according to the fourth embodiment and therefore the cooling apparatus can easily assembled.

Figure 7:
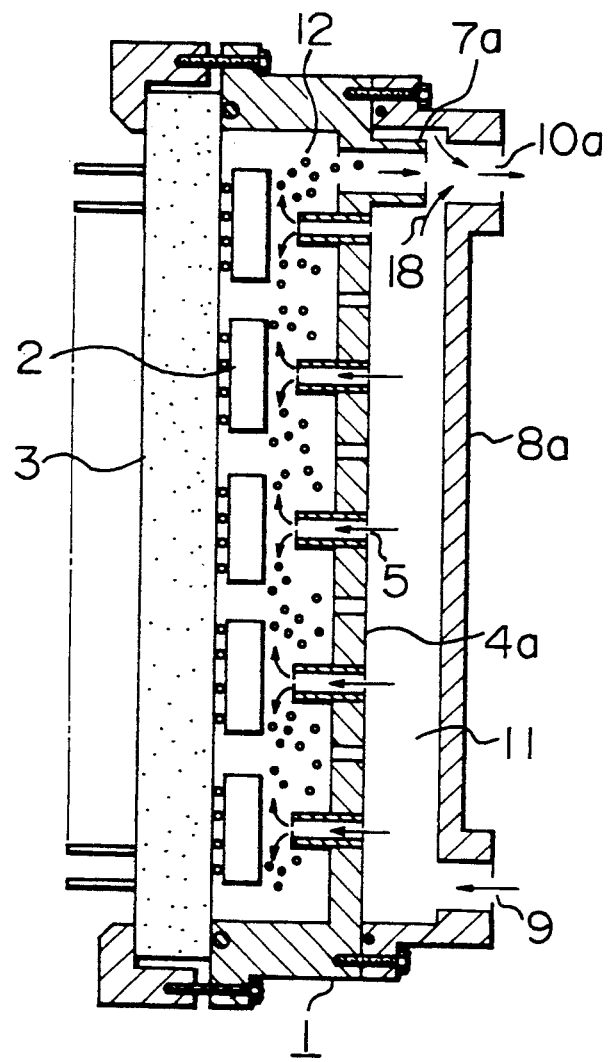
FIG. 7 is a cross sectional view which illustrates a fifth embodiment of the present invention.

The embodiment of FIG. 7 is arranged in such a manner that a housing 4a has the first nozzles 5 for jetting the low temperature refrigerant liquid 11 to the semiconductor devices 2 and a discharge pipe 7a for discharging the high temperature refrigerant liquid 12 which has cooled the semiconductor devices 2. Furthermore, the refrigerant liquid introducing/discharging header 8a covers the housing 4a, the refrigerant liquid introducing/discharging header 8a having a low temperature refrigerant liquid inlet port 9 and a high temperature refrigerant liquid outlet port 10a. The end surface of the discharge pipe 7a for discharging the high temperature refrigerant liquid and the high temperature refrigerant liquid discharge port 10a are disposed coaxially via a gap 18.

In the cooling apparatus according to embodiment of FIG. 7, the low temperature refrigerant liquid 11 introduced through the low temperature refrigerant liquid inlet port 9 of the refrigerant liquid introducing/discharging header 8a is jetted through the first nozzles 5 to the semiconductor devices 2, and then the low temperature refrigerant liquid 11 sequentially cools a plurality of the semiconductor devices 2. Hence, the low temperature refrigerant liquid 11 becomes the high temperature refrigerant liquid 12 in the gas-liquid phase which passes through the discharge pipe 7a for discharging the high temperature refrigerant liquid 12 before it is discharged through the high temperature refrigerant liquid outlet port 10a of the refrigerant liquid introducing/discharging header 8a.

When a portion of the low temperature refrigerant liquid 11 in the refrigerant liquid introducing/discharging header 8a is mixed with the high temperature liquid 12 in the gas-liquid phase after it has passed through the gap 18 formed between the end surface of the high temperature refrigerant liquid discharge pipe 7a and the high temperature refrigerant liquid outlet port 10a, the temperature of the high temperature refrigerant liquid is rapidly lowered. Hence, the vapor bubbles in the gas phase included by the high temperature refrigerant liquid flow can be efficiently condensed and they disappear. As a result, the semiconductor device 2 can always be cooled stably because an undesirable temporarily retention of a portion of the boiled bubbles at an intermediate point of the high temperature refrigerant liquid discharge pipe (outlet pipe), causing the refrigerant liquid flow to be made intermittent and unstable, can be prevented.

Although the embodiment of FIG. 7 is arranged in such a manner that a portion of the low temperature refrigerant liquid 11 is introduced through the gap 18 formed between the end surface of the discharge pipe 7a for discharging the high temperature refrigerant liquid and the high temperature refrigerant liquid outlet port 10a so as to be mixed with the high temperature refrigerant liquid flow, a similar effect and operation can be realized by another structure arranged in such a manner that a hole is formed in the side wall of the high temperature refrigerant liquid discharge pipe 7 because the portion of the low temperature refrigerant liquid 11 is able to be introduced into the high temperature refrigerant liquid flow.

Figure 8:
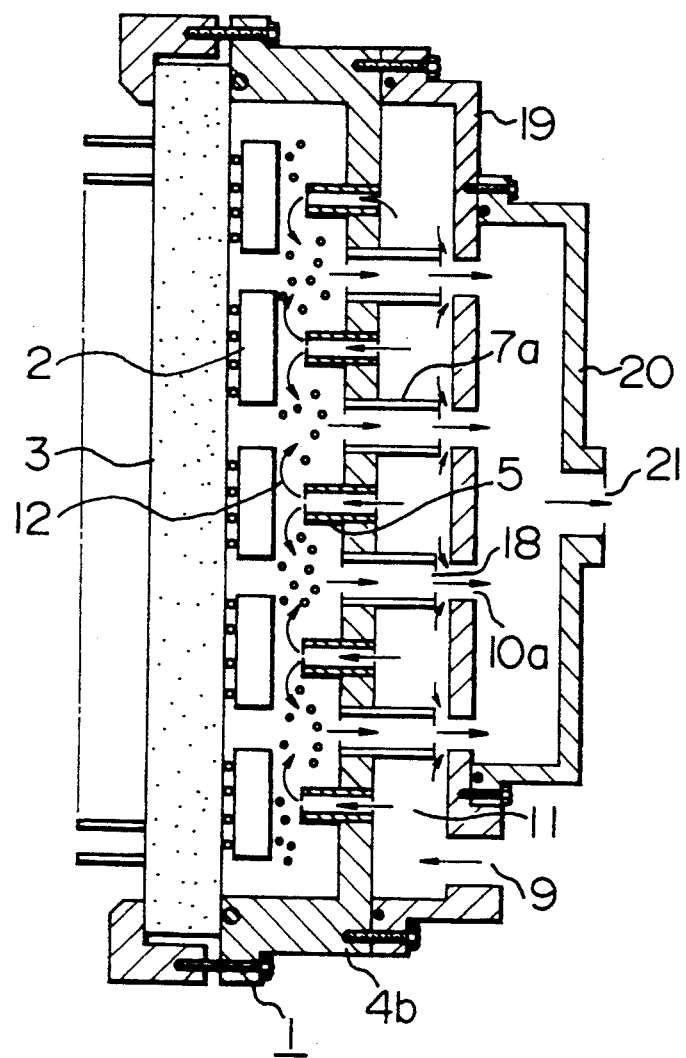
FIG. 8 is a cross sectional view which illustrates a sixth embodiment of the present invention.

The embodiment of FIG. 8 is arranged in such a manner that a housing 4b has first nozzles 5 for jetting the low temperature refrigerant liquid 11 to corresponding semiconductor devices 2 and a plurality of the discharge pipes 7a for discharging the high temperature refrigerant liquid 12 which has cooled the semiconductor devices 2. A cooling liquid introducing header 19 covers the housing 4b, the cooling liquid introducing header 19 having a low temperature refrigerant liquid inlet port 9 and a plurality of high temperature refrigerant liquid outlet port 10a. The end surface of a plurality of the high temperature refrigerant liquid discharge pipe 7a and the high temperature refrigerant liquid outlet ports 10a are disposed to concentrically face one anther via the gaps 18. Furthermore, a refrigerant liquid discharging header 20 covers the refrigerant liquid introducing header 19, the refrigerant liquid discharging header 20 having a high temperature refrigerant liquid discharge port 21 for collectively discharging the high temperature refrigerant liquid 12 discharged from a plurality of the high temperature refrigerant liquid output port 10a. Although the same gaps 18 are formed in the structure according to this embodiment, the size of them may be changed so as to be adaptable to the heating values of the semiconductor devices 2.

Since the embodiment of FIG. 7 is arranged in such a manner that a plurality of the discharge pipes 7a for discharging the high temperature refrigerant liquid are disposed, the high temperature gas-liquid phase refrigerant liquid converted from the low temperature refrigerant liquid 11 does not reach the other semiconductor devices 2 after the low temperature refrigerant liquid 11 has been introduced through the low temperature refrigerant liquid inlet port 9 of the refrigerant liquid introducing head 19 and jetted to the semiconductor devices 2 through the corresponding first nozzles 5 to cool the semiconductor device 2. The high temperature gas-liquid phase refrigerant liquid passes through the discharge pipes 7a for discharging the high temperature refrigerant liquid, the discharge pipes 7a being arranged adjacent to the semiconductor device 2 to be cooled before it is discharged immediately through the high temperature refrigerant liquid outlet ports 10a of the refrigerant liquid introducing header 19 to the refrigerant liquid discharging header 20.

When the low temperature refrigerant liquid 11 in the refrigerant liquid introducing header 19 is mixed with the high temperature refrigerant liquid 12 in the gas-liquid phase after it has passed through the gap 18 formed between the end surface of the high temperature refrigerant liquid discharge pipe 7a and the high temperature refrigerant liquid outlet port 10a, the temperature of the high temperature refrigerant liquid 12 is rapidly lowered. Hence, the vapor bubbles in the gas phase included by the flow of the high temperature refrigerant liquid 12 can be condensed efficiently and they disappear. As a result, the refrigerant liquid in the gas-liquid phase, the temperature of which has been raised because it has cooled the semiconductor device 2, can be discharged in such a manner that the high temperature refrigerant liquid does not affect the other semiconductor devices 2. Furthermore, an undesirable temporary retention of a portion of the boiled bubbles at an intermediate point of the high temperature refrigerant liquid discharge pipe causing the refrigerant liquid flow to be made intermittent and unstable can be prevented. Therefore, the semiconductor devices 2, which generate considerable heat, can always be cooled stably.

Figure 9:
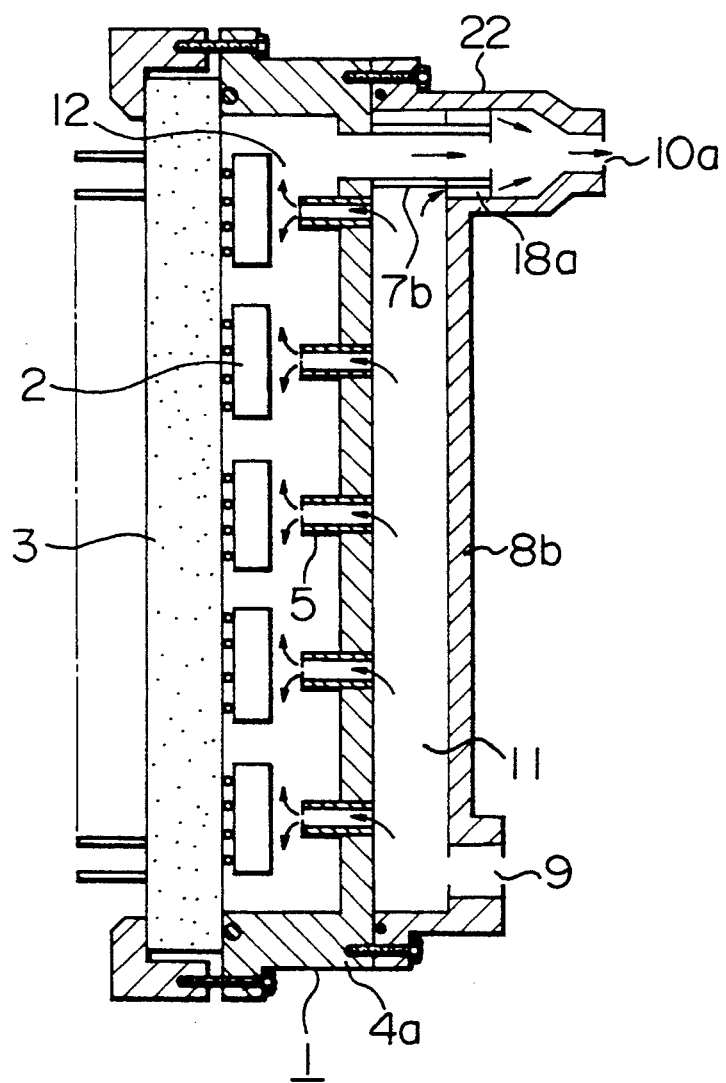
FIG. 9 is a cross sectional view which illustrates a seventh embodiment of the present invention.
Figure 10:
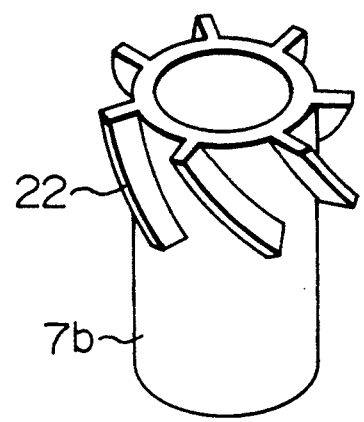
FIG. 10 is an enlarged perspective view which illustrates an essential portion of a discharge pipe for discharging a high temperature refrigerant liquid flow shown in FIG. 9.

The embodiment FIGS. 9 and 10 is arranged in such a manner that an end portion of the high temperature refrigerant liquid discharge pipe 7b is inserted into the high temperature refrigerant liquid outlet port 10a of the refrigerant liquid introducing/discharging header 8b while having a gap 18a. Furthermore, a plurality of guide wings 22 for generating swirling flows at the outer wall of the portion into which the discharge pipe 7b is inserted are formed in the gap 18a.

In the construction according to the embodiment of FIGS. 9 and 10, when the high temperature refrigerant liquid 12 passes through the discharge pipe 7b, the low temperature refrigerant liquid 11 in the refrigerant liquid introducing/discharging header 8b is mixed with the high temperature refrigerant liquid 12 in the gas-liquid phase while being swirled by the guide wings 22 after it has passed through the gap 18a formed between the discharge pipe 7b and the high temperature refrigerant liquid outlet port 10a. Therefore, the temperature of the high temperature refrigerant liquid 12 is lowered rapidly. Hence, the vapor bubbles in the gas phase included by the flow of the high temperature refrigerant liquid 12 can be condensed efficiently and they disappear. As a result, the undesirable temporary retention of a portion of the boiled bubbles at an intermediate point of the high temperature refrigerant liquid discharge pipe, causing the refrigerant liquid flow to be made intermittent and unstable, can be prevented. Therefore, the semiconductor devices 2 which generates considerable heat can always be cooled stably.

Figure 12:
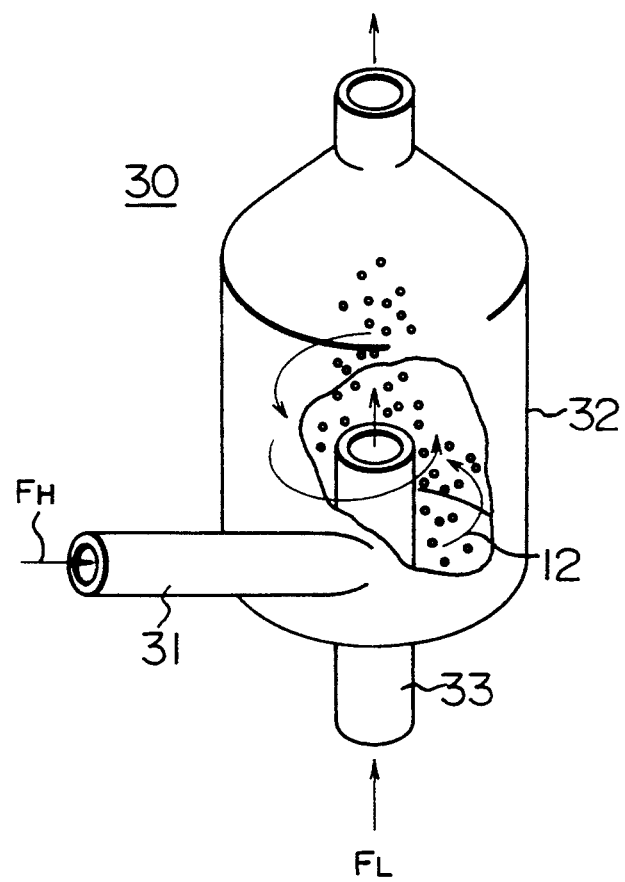
FIG. 12 is an enlarged perspective view which illustrates an essential portion of a defoamer shown in FIG. 11.
Figure 11:
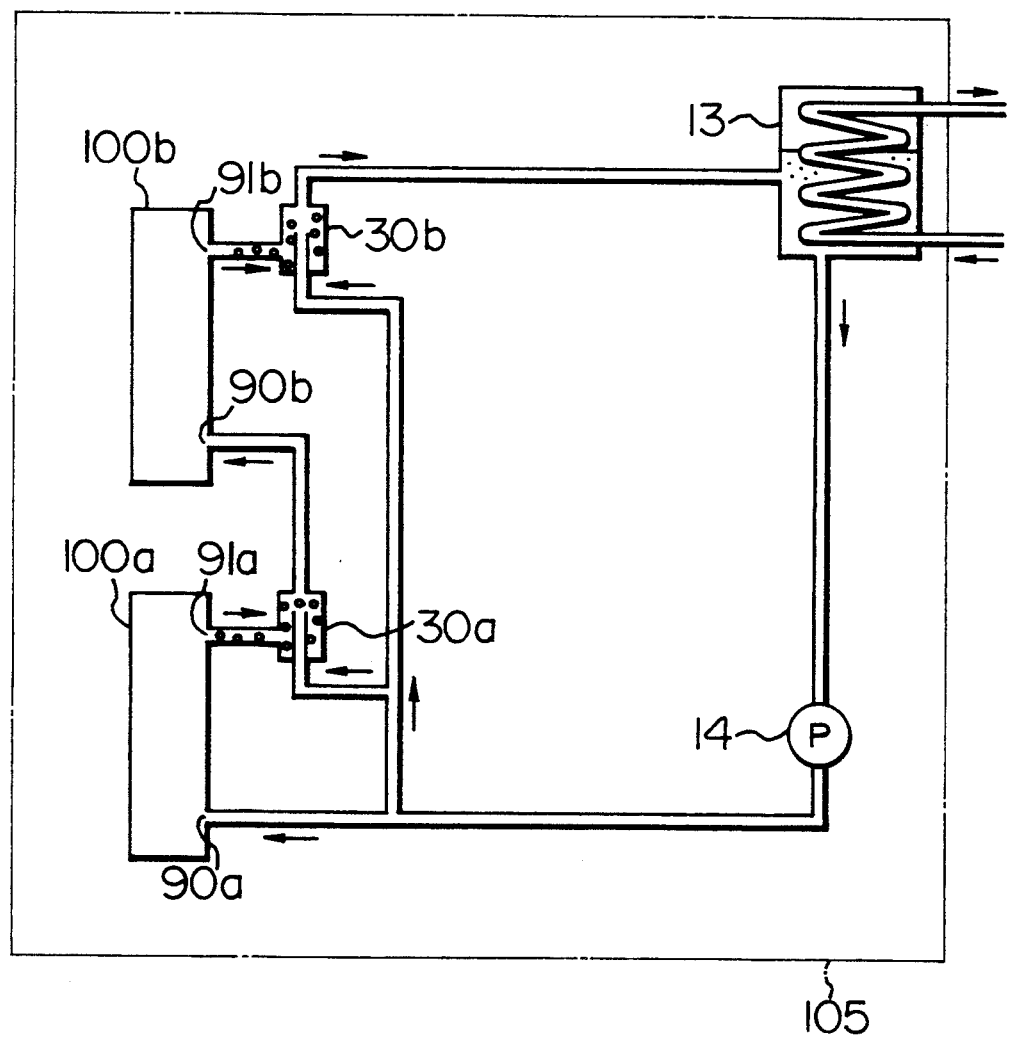
FIG. 11 is a cross sectional view which illustrates a portion of an essential portion of an eighth embodiment of the present invention.

In the embodiment of FIGS. 11 and 12, liquid cooling multichip modules 100a and 100b including a plurality of semiconductor devices and the like which generate heat are mounted on a case 105. An outlet port of the external cooler 13 is, via the pressure pump 14, connected to a low temperature refrigerant liquid inlet port 90a of the multichip module 100a and to a plurality of defoamers 30a and 30b which divides the gas-liquid phase refrigerant liquid into the gas phase and the liquid phase so as to defoam the refrigerant liquid. High temperature refrigerant outlet ports 91a and 91b of the corresponding multichip modules 100a and 100b are connected to the defoamers 30a and 30b. The outlet port of the defoamer 30a and a low temperature refrigerant liquid inlet port 90b are connected to each other by a pipe, while the defoamer 30b and the inlet port of the external cooler 13 are connected similarly. An inlet pipe 31 of the defoamer 30 is diagonally fastened to a container 32 for accommodating the defoamer 30 so that the gas-liquid phase flow in the container 32 is swirled. A low temperature refrigerant liquid introducing pipe 30 is inserted through the central portion of the bottom of the defoamer 30.

In the construction of the embodiment of FIGS. 11 and 12, when the gas-liquid phase high temperature refrigerant liquid 12, which contains boiled bubbles formed due to heat which is higher than the boiling point and which has been generated by the semiconductor devices in the liquid cooling type multichip module 100, is introduced through the inlet pipe 31 diagonally fastened to the container 32 of the defoamer 30, the gas-liquid phase flow swirls in the container 32. As a result, vapor bubbles in high temperature refrigerant liquid flow $F_H$ are gathered to the center of rotation due to the centrifugal separation effect of the swirling flow. When low temperature refrigerant liquid flow $F_L$ is partially jetted, or sprayed or mixed through the low temperature refrigerant liquid introduction pipe 33, the gas vapor can further efficiently be condensed and it disappear and as well as the temperature of the high temperature refrigerant liquid flow can be lowered. Therefore, the cooling effect of the liquid-cooling type multichip module 100b disposed in the lower stream does not deteriorate and therefore it can be always stably and sufficiently cooled. Furthermore, an undesirable temporarily retention of a portion of the boiled bubbles at an intermediate point of the piping which reaches the external cooler 13 causing the refrigerant liquid flow to be made intermittent and unstable can be prevented. Therefore, the semiconductor devices 2 in the multichip module 100 which generates considerable heat can always stably be cooled.

Figure 13:
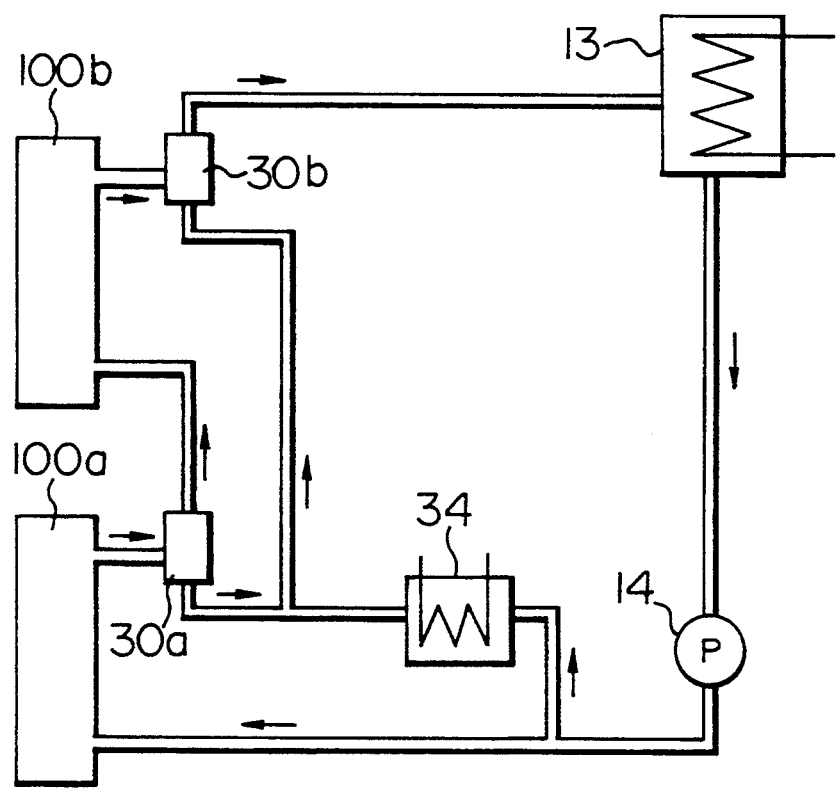
FIG. 13 is a structural view which illustrates a ninth embodiment of the present invention.

The embodiment of FIG. 13 is arranged in such a manner that a low temperature external cooler 34 capable of further cooling the refrigerant liquid in comparison to the external cooler 13 is disposed in front of the inlet ports of a plurality of the defoamers 30a and 30b, the gas phase vapor in the defoamer can further be condensed and it can be allowed to disappear. Furthermore, the temperature of the high temperature refrigerant liquid can be further lowered. Therefore, the multichip module 100b disposed in the lower stream can always stably and sufficiently be cooled. In addition, the undesirable temporary retention of a portion of the boiled bubbles at an intermediate point of the piping which reaches the external cooler 13, causing the flow of the refrigerant liquid to be made intermittent and unstable, can be prevented. Therefore, the semiconductor devices 2 in the multichip module 100 which generates considerable heat can always be cooled stably.

Figure 14:
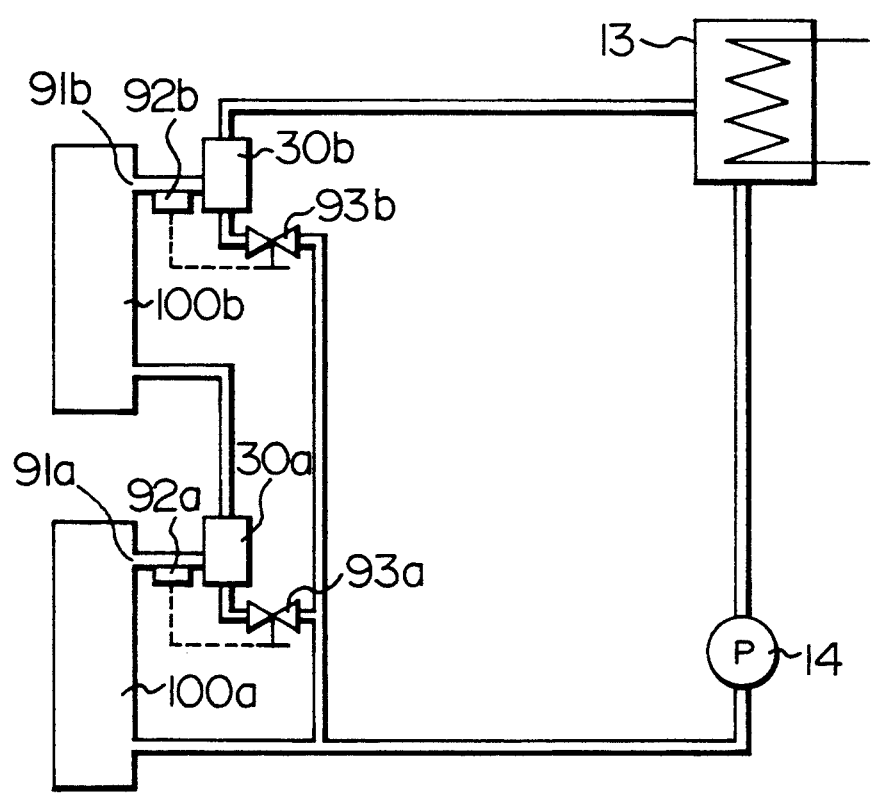
FIG. 14 is a structural view which illustrates a tenth embodiment of the present invention.

The embodiment of FIG. 14 is arranged in such a manner that sensors 92a and 92b for monitoring the quantity of boiled bubbles are fastened to the high temperature refrigerant liquid outlet ports 91a and 91b. Furthermore, control valve 93a and 93b for controlling the quantity of the low temperature refrigerant liquid flow to be jetted or and that to be mixed before the low temperature refrigerant liquid flow is introduced into the defoamers 30a and 30b, the control valves 93a and 93b controlling the aforesaid quantity in accordance with the outputs from the sensors 92a and 92b. Therefore, the high temperature refrigerant liquid flow to be discharged through the outlet port of each of the defoamers 30a and 30b can always be controlled stably and therefore all of the semiconductor devices in the multichip module 100 can be cooled stably.

Figure 15:
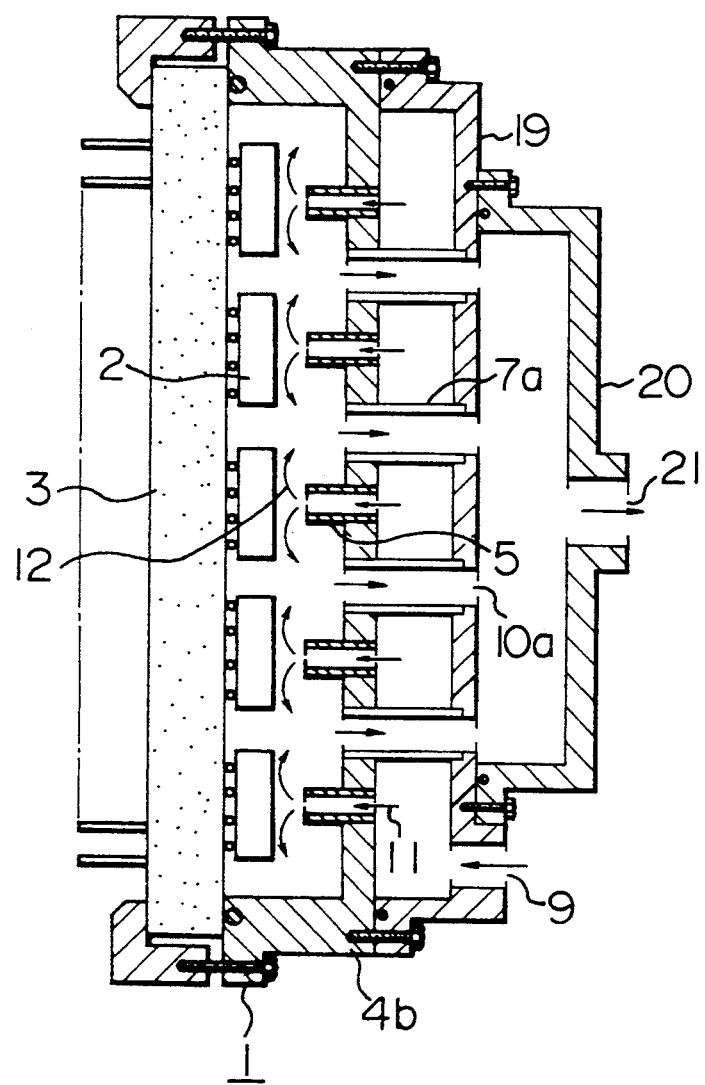
FIG. 15 is a structural view which illustrates an eleventh embodiment of the present invention.

The embodiment of FIGS. 15 and 16 is arranged in such a manner that the housing 4b has the first nozzles 5 for respectively jetting the low temperature refrigerant liquid 11 to the semiconductor devices 2. Furthermore, a plurality of discharge pipes 7a for discharging the high temperature refrigerant liquid 12, which cools the semiconductor devices 2, are respectively disposed between the disposed first nozzles 5. The refrigerant liquid introducing header 19 covers the housing 4b, the refrigerant liquid introducing header 19 having the low temperature refrigerant liquid inlet port 9 and a multiplicity of high temperature refrigerant liquid outlet ports 10a. The end portions of a plurality of the high temperature refrigerant liquid discharge pipes 7a are inserted into the high temperature refrigerant liquid outlet ports 10a.

Furthermore, the refrigerant liquid discharging header 20 covers the refrigerant liquid introducing header 19, the refrigerant liquid discharging header 20 having the high temperature refrigerant liquid discharge port 21 which collectively discharges the high temperature refrigerant liquid 12 discharged from a multiplicity of the high temperature refrigerant liquid outlet ports 10a. Although the high temperature refrigerant liquid discharge pipe 7a have the same size according to the embodiment of FIGS. 15 and 16, they may have different sizes to correspond to the heating values of the semiconductor devices 2.

Since the embodiment of FIGS. 15 and 16 is arranged in such a manner that a plurality of the high temperature refrigerant liquid discharge pipes 7a are disposed, when the low temperature refrigerant liquid 11 introduced through the low temperature refrigerant liquid inlet port 9 of the refrigerant liquid introducing header 19 and jetted from each of the first nozzles 5 to the semiconductor devices 2 is converted into the high temperature refrigerant liquid, the high temperature refrigerant liquid does not reach the other semiconductor devices 2. As an alternative to this, it passes through the high temperature refrigerant discharge pipes 7a disposed adjacent to the semiconductor devices 2 to be cooled before it is discharged through the high temperature refrigerant liquid outlet ports 10a of the refrigerant liquid introducing header 19 to the refrigerant liquid discharging header 20. Therefore, the semiconductor devices 2 can be independently cooled. Furthermore, the structure having a plurality of low temperature refrigerant liquid jetting nozzles and high temperature refrigerant liquid discharge pipes 7a will prevent the fluid pressure loss of the refrigerant liquid. Hence, a large quantity of the refrigerant liquid can be introduced/discharged and therefore the semiconductor devices 2, which generates considerable heat, can be cooled efficiently.

Since the present invention is arranged in such a manner that heat generating members such as the semiconductor devices each including an integrated circuit device (LSI) are cooled by supplied low temperature refrigerant liquid, in such a way that a portion of the low temperature refrigerant liquid is branched to be jetted, or sprayed or mixed with the gas-liquid phase high temperature refrigerant liquid flow which cools the heat generating elements before it is discharged, the vapor bubbles in the gas phase contained in the high temperature refrigerant liquid flow can be condensed efficiently and caused to disappear by the low temperature refrigerant liquid. Therefore, a problem that the cooling performance deteriorates because the boiled bubbles cover the heat generating elements such as the semiconductor devices positioned in the lower stream of the refrigerant liquid flow can be prevented. Hence, even heat generating elements which generate considerably large heating value with which an excessively large quantity of boiled bubbles will be generated can always be cooled stably and sufficiently. Another effect can be obtained in that the reliability of the heat generating members can be improved because an excessively large load does not act on the heat generating members or the junctions of the heat generating members, due to the fact that the heat generating members can efficiently be cooled while eliminating the necessity of spraying a large quantity of the refrigerant liquid from the nozzle.

Also according to the present invention, an effect can be obtained in that the rise of the temperature of the gas-liquid phase high temperature refrigerant liquid, which cools the heat generating members before it is discharged, can be prevented because the flow of the refrigerant liquid passing over the heat generating members is increased in the lower stream due to the arrangement of the present invention made that a portion of the low temperature refrigerant liquid flow is sequentially introduced into the gas-liquid phase high temperature refrigerant liquid flow which cools he heat generating members before it is discharged. Furthermore, the problem that a portion of the boiled bubbles is undesirably retained at an intermediate position of the pipes, through which the high temperature refrigerant liquid is discharged, causing the flow of the refrigerant liquid to become intermittent and unstable, can be prevented.

According to the present invention, an effect can be obtained in that the heat generating members can always stably be cooled because the quantity of the low temperature refrigerant liquid flow to be jetted so as to be introduced into the gas-liquid phase high temperature refrigerant liquid flow or that to be mixed with the same is controlled by monitoring the quantity of boiled bubbles in the high temperature refrigerant liquid flow.

According to the present invention, it is sufficient for the outlet pipe, which discharges the high temperature refrigerant liquid which cools heat generating members before it is discharged, to be inserted simply into the high temperature refrigerant liquid discharging port formed on the outer wall of a header which jets the low temperature refrigerant liquid to the heat generating members. Therefore, an apparatus for cooling semiconductor devices constructed in accordance with the present invention can be easily assembled and disassembled can be provided.

Since the present invention is arranged in such a manner that the outlet pipe for discharging the high temperature refrigerant liquid flow, which cools heat generating members before the flow is discharged, is disposed between disposed nozzles for jetting the low temperature refrigerant liquid to the heat generating members, a large quantity of refrigerant liquid can be allowed to flow toward each semiconductor device while eliminating a mutual interference and while preventing a pressure loss. Therefore, heat generating members such as the semiconductor devices which generate considerable heat can be efficiently cooled.

What is claimed is:

1. An apparatus for cooling heat generating members by means of a refrigerant liquid flow, said apparatus for cooling heat generating members comprising:

first means for directing a first portion of a low temperature refrigerant liquid against said heat generating members for cooling said heat generating members and thereby heating said first portion of refrigerant liquid to a high temperature and causing boiled bubbles of said refrigerant liquid to occur in said first portion and second means for mixing, with each other, a second portion of said low temperature refrigerant liquid and said high temperature refrigerant liquid which has cooled said heat generating members to cause boiled bubbles in said high temperature refrigerant liquid to disappear.

2. An apparatus for cooling heat generating members by dipping or boiling by means of a refrigerant liquid flow, said apparatus for cooling heat generating members comprising:

first means for branching a portion of a low temperature refrigerant liquid against said heat generating members for cooling said heat generating members and thereby heating said portion of refrigerant liquid to a high temperature and causing boiled bubbles of said refrigerant liquid to occur, and second means for mixing, with each other, another portion of said low temperature refrigerant liquid and said high temperature refrigerant with liquid with boiled bubbles which has cooled said heat generating members to cause boiled bubbles in said high temperature refrigerant liquid to disappear.

3. An apparatus for cooling heat generating members by means of a refrigerant liquid flow, said apparatus for cooling heat generating members comprising:

first means for jetting a portion of a low temperature refrigerant liquid into contact with one or a plurality of said heat generating members for cooling the same and thereby heating said refrigerant liquid to a high temperature and causing boiled bubbles of said refrigerant liquid to occur, and second means for directing another portion of said low temperature refrigerant liquid into said high temperature refrigerant liquid with boiled bubbles therein, so that the gas phase from said boiled bubbles in said high temperature refrigerant liquid flow disappears.

4. An apparatus for cooling heat generating members by means of a refrigerant liquid flow, said apparatus for cooling heat generating members comprising:

a low temperature refrigerant liquid for cooling heat generating members in a manner which causes boiled bubbles of said refrigerant liquid to occur, first nozzles for jetting a portion of said low temperature refrigerant liquid into contact with said heat generating members for cooling said members and heating said portion of refrigerant liquid to a high temperature and causing boiling bubbles of said refrigerant liquid to occur, and a means for mixing having second nozzles disposed adjacent to said first nozzles, for jetting another portion of said low temperature refrigerant liquid into a gas-liquid phase of said high temperature refrigerant flow, which has cooled said heating generating members, before it is discharged so the gas phase boiled bubbles in said high temperature refrigerant liquid flow are caused to disappear.

5. An apparatus for cooling heat generating members according to claim 4, wherein the size of said first nozzles and that of said second nozzles are predetermined in accordance with a heating value of said heat generating members.

6. An apparatus for cooling heat generating members according to claim 1, wherein said heat generating members are semiconductor devices.

7. An apparatus for cooling heat generating members according to claim 2, wherein said heat generating members are semiconductor devices.

* * * * *